US009594309B2

(12) United States Patent
Huang et al.

(10) Patent No.: US 9,594,309 B2
(45) Date of Patent: Mar. 14, 2017

(54) METHOD AND APPARATUS TO CHARACTERIZE PHOTOLITHOGRAPHY LENS QUALITY

(71) Applicant: TAIWAN SEMICONDUCTOR MANUFACTURING COMPANY, LTD., Hsin-Chu (TW)

(72) Inventors: Guo-Tsai Huang, New Taipei (TW); Chih-Ming Ke, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/797,741

(22) Filed: Jul. 13, 2015

(65) Prior Publication Data

US 2015/0316859 A1 Nov. 5, 2015

Related U.S. Application Data

(62) Division of application No. 13/365,733, filed on Feb. 3, 2012, now Pat. No. 9,097,978.

(51) Int. Cl.
   *G03B 27/68* (2006.01)
   *G03F 7/20* (2006.01)
   *G03F 1/44* (2012.01)

(52) U.S. Cl.
   CPC ............... *G03F 7/706* (2013.01); *G03F 1/44* (2013.01); *G03F 7/70591* (2013.01); *G03F 7/70633* (2013.01)

(58) Field of Classification Search
   CPC ............... G03F 7/70591; G03F 7/7066; G03F 7/70633; G03F 7/705; G03F 7/70516; G03F 7/70466; G03F 7/70991; G03F 7/706; G03F 7/70616; G03F 7/70675; G03F 7/70683; G03F 1/44
   (Continued)

(56) References Cited

U.S. PATENT DOCUMENTS 5,442,418 A * 8/1995 Murakami .......... G03F 7/70241
                                                      355/52
2001/0055720 A1* 12/2001 Sato ..................... G03F 7/70633
                                                      430/5
(Continued)

OTHER PUBLICATIONS

Christian Summerer et al., "Sensitivity of Coma Monitors to Resist Processes" Optical Microlithography XIII, Proceeds of SPIE vol. 4000 (2000). pp. 1237-1244.

*Primary Examiner* — Christina Riddle
(74) *Attorney, Agent, or Firm* — Haynes and Boone, LLP

(57) ABSTRACT

Provided is a method of characterizing photolithography lens quality. The method includes selecting an overlay pattern having a first feature with a first pitch and a second feature with a second pitch different than the first pitch, performing a photolithography simulation to determine a sensitivity coefficient associated with the overlay pattern, and providing a photomask having the overlay pattern thereon. The method also includes exposing, with a photolithography tool, a wafer with the photomask to form the overlay pattern on the wafer, measuring a relative pattern placement error of the overlay pattern formed on the wafer, and calculating a quality indicator for a lens in the photolithography tool using the relative pattern placement error and the sensitivity coefficient.

20 Claims, 14 Drawing Sheets

(58) Field of Classification Search
USPC ......... 355/30, 46, 52, 53, 55, 67–71, 72–77; 430/5, 8, 22, 30, 311, 321; 250/492.1, 250/492.2, 492.22, 493.1, 548
See application file for complete search history.

(56) References Cited

U.S. PATENT DOCUMENTS

| | | |
|---|---|---|
| 2002/0071112 A1 | 6/2002 | Smith et al. |
| 2004/0088071 A1 | 5/2004 | Kouno et al. |
| 2004/0119956 A1 | 6/2004 | Fukagawa |
| 2006/0008716 A1 | 1/2006 | Jeunink et al. |
| 2006/0227310 A1 | 10/2006 | Buurman et al. |
| 2006/0256322 A1 | 11/2006 | Bowes |
| 2007/0002293 A1* | 1/2007 | Park ................. G03F 7/706 355/52 |
| 2011/0133347 A1 | 6/2011 | Huang et al. |

* cited by examiner

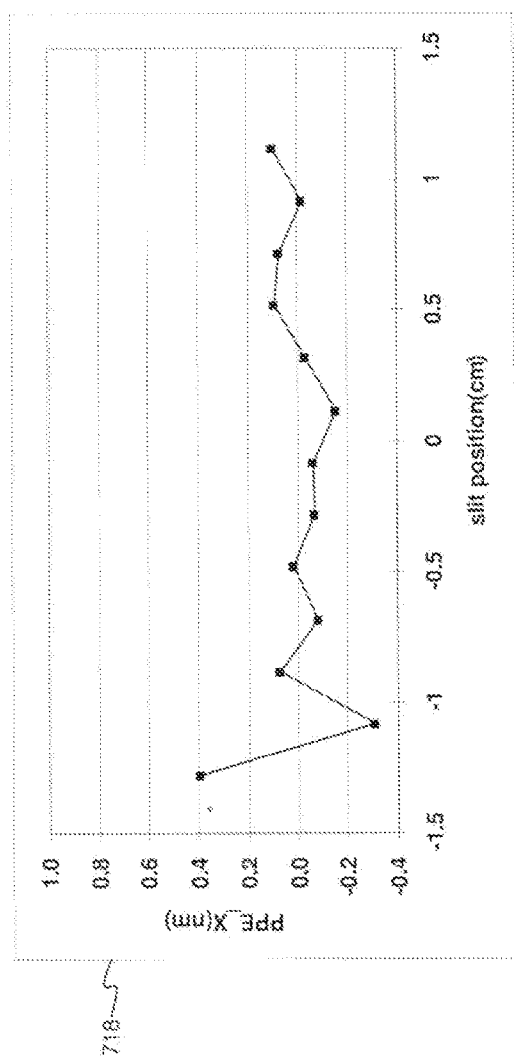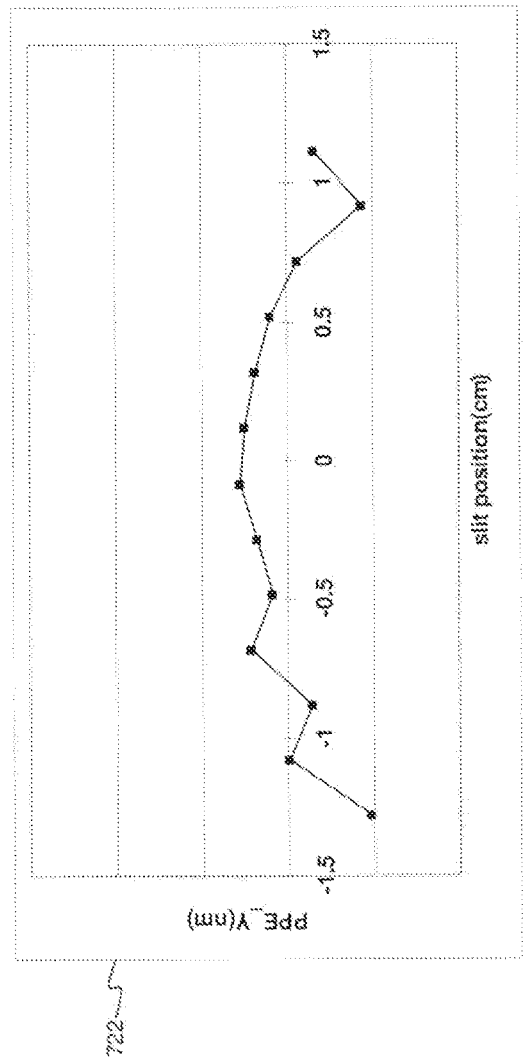

$$\begin{bmatrix} OVL_s(1) \\ \vdots \\ OVL_s(8) \end{bmatrix} = Z_7 \cdot \begin{bmatrix} S_7(1) \\ \vdots \\ S_7(8) \end{bmatrix} + Z_{10} \cdot \begin{bmatrix} S_{10}(1) \\ \vdots \\ S_{10}(8) \end{bmatrix} + Z_{14} \cdot \begin{bmatrix} S_{14}(1) \\ \vdots \\ S_{14}(8) \end{bmatrix} + Z_{19} \cdot \begin{bmatrix} S_{19}(1) \\ \vdots \\ S_{19}(8) \end{bmatrix} + Z_{23} \cdot \begin{bmatrix} S_{23}(1) \\ \vdots \\ S_{23}(8) \end{bmatrix} + Z_{26} \cdot \begin{bmatrix} S_{26}(1) \\ \vdots \\ S_{26}(8) \end{bmatrix} + Z_{30} \cdot \begin{bmatrix} S_{30}(1) \\ \vdots \\ S_{30}(8) \end{bmatrix} + Z_{34} \cdot \begin{bmatrix} S_{34}(1) \\ \vdots \\ S_{34}(8) \end{bmatrix}$$

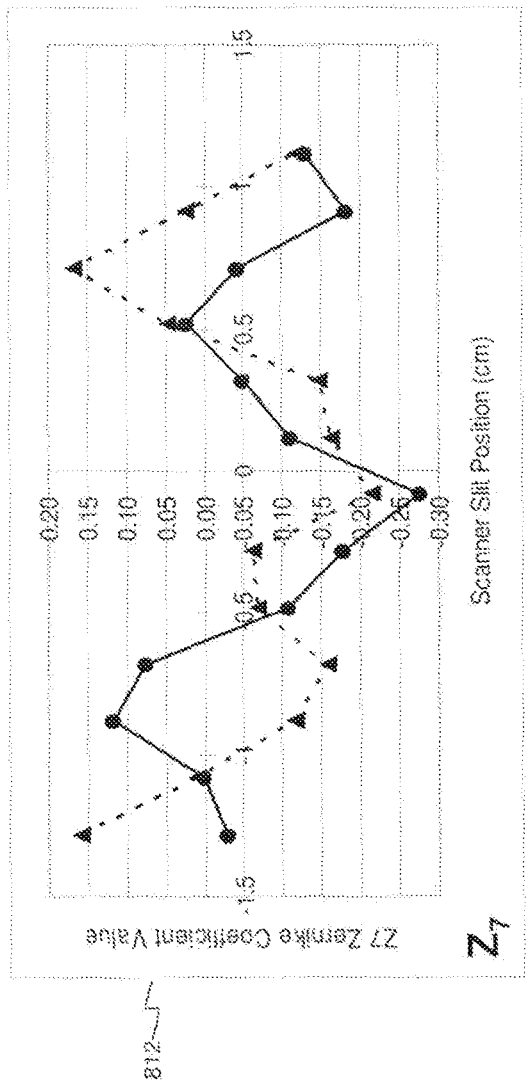
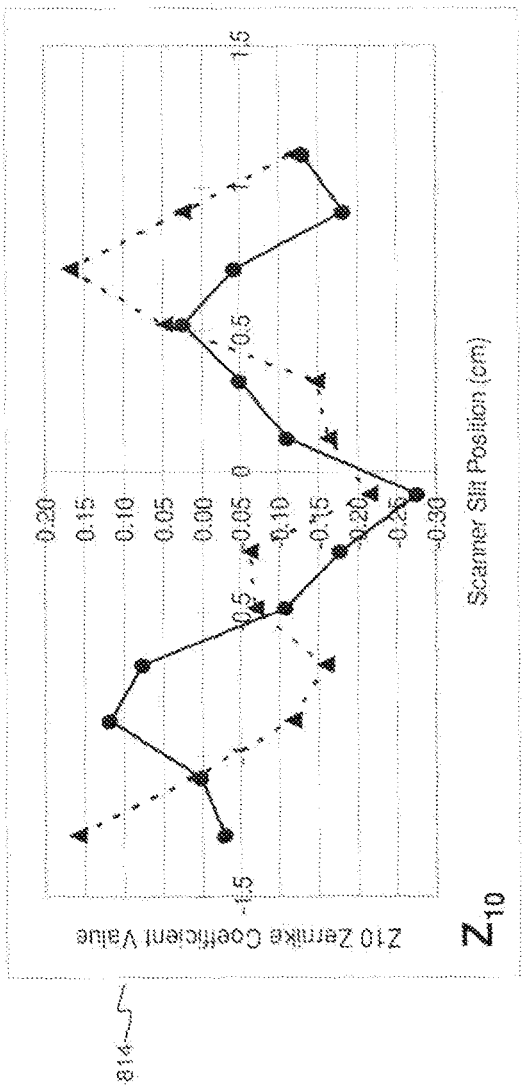

METHOD AND APPARATUS TO CHARACTERIZE PHOTOLITHOGRAPHY LENS QUALITY

CROSS-REFERENCE

This application is a divisional of U.S. patent application Ser. No. 13/365,733, filed on Feb. 3, 2012, the entirety of which is hereby incorporated by reference.

TECHNICAL FIELD

The present disclosure relates generally to a semiconductor fabrication, and more particularly, to a method and apparatus to characterize the quality of a photolithography lens.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The need for small geometry sizes places stricter demands on a photolithography process. In particular, the alignment between various layers in the semiconductor device (also referred to as overlay) needs to be precise and accurate. In other words, it is desirable to reduce overlay errors. Overlay marks (overlay patterns) may be used to measure the overlay error on wafers patterned by a photolithography tool. The size of the measured overlay error corresponds to the quality of the lens in the photolithography tool used to pattern the wafer. As geometry sizes become increasingly small, existing overlay marks and existing methods to characterize the quality of photolithography tool lenses may not be sufficient. Thus, lens quality assessments may be skewed, which may lead to more chip failures.

Therefore, while existing overlay marks and lens quality characterization methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 11 illustrates an example line graph depicting the values of average x-components of pattern placement error vectors.

FIG. 12 illustrates an example line graph depicting the values of average y-components of pattern placement error vectors.

FIG. 14 illustrates a system of Zernike polynomial equations that may be used to calculate the quality of a photolithography lens in terms of Zernike coefficients.

FIG. 15 is an example line graph depicting the values of $Z_7$ Zernike coefficients associated with 13 exposure slit positions.

FIG. 16 is an example line graph depicting the values of $Z_{10}$ Zernike coefficients associated with 13 exposure slit positions.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
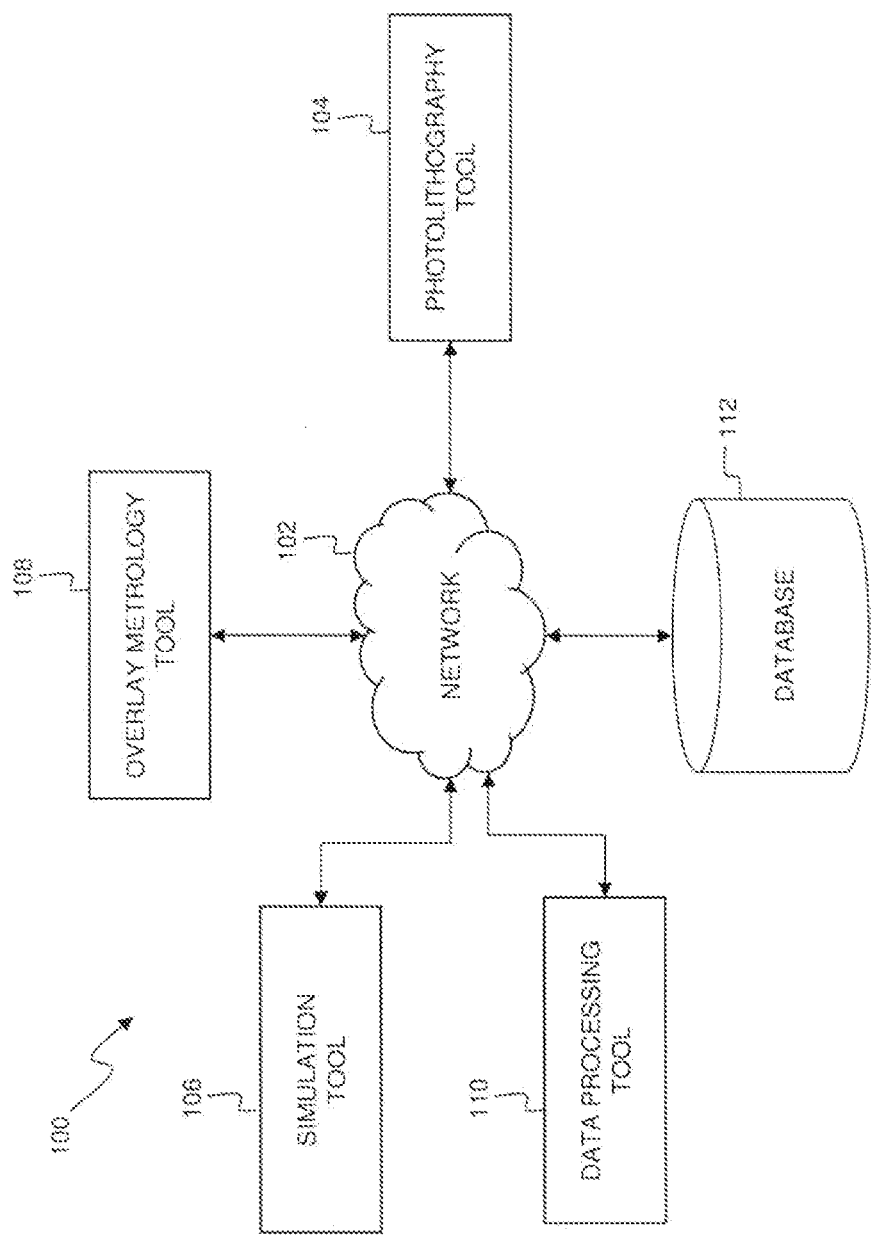
FIG. 1 is a functional block diagram of a semiconductor fabrication system that embodies various aspects of the present disclosure.

FIG. 1 is a functional block diagram of a semiconductor fabrication system 100 that embodies various aspects of the present disclosure. The system 100 comprises a plurality of semiconductor fabrication components that are connected by a communications network 102. The network 102 may be a single network or may be a variety of different networks, such as an intranet and the Internet, and may include both wired and wireless communication channels. Each component may interact with other components and may provide services to and/or receive services from the other entities. Further, the network-connected components may be all located in a single fabrication location or may be geographically dispersed. In the illustrated embodiment the system 100 includes a photolithography tool 104, a photolithography simulation tool 106, an overlay metrology tool 108, a data processing tool 110, and a database 112. It is understood that the system 100 may further comprise various other processing tools (e.g., etching tools, deposition tools, chemical mechanical polishing (CMP) tools, furnaces, etc.), metrology equipment (e.g., an after-etching-inspection (AEI) metrology tool), and controllers (e.g., an Advanced Process Control (APC) system) that perform other stages of semiconductor fabrication but are not illustrated for the sake of simplicity and clarity.

In the illustrated embodiment, the photolithography tool 104 is a projection-based scanner of a type known in the art. Generally, the photolithography tool 104 projects radiation onto a photosensitive layer (e.g., photoresist) on a wafer to create patterns that form various features of an integrated circuit. In more detail, the photolithography tool 104 outputs small-wavelength light through a lens that directs the light through an exposure slit and onto a photomask that contains transparent and opaque areas that form the pattern sought to be created on a wafer. After the light is patterned by the photomask, it is reduced and projected onto one exposure field out of many on the wafer. Notably, the exposure slit is as wide as the photomask but is only a fraction of its length, so the light emanating from the slit must be "scanned" across the photomask to expose an entire field on the wafer. After the entire field has been exposed (i.e. scanned), the wafer and/or photomask is stepped to the next field on the wafer, so that the photomask pattern may be exposed again on the next field. In alternative embodiments, the photolithography tool 104 may operate in different manners.

To maintain high semiconductor fabrication standards, it may be necessary to monitor the quality of the lenses in photolithography tools, such as photolithography tool 104. The quality of a lens in photolithography tool 104 may be characterized by its cross-slit aberration—i.e., lens imperfection as measured at a plurality of locations along the length of the exposure slit. As described in more detail below, lens aberration/imperfection may be quantified by one or more Zernike coefficients. Different Zernike coefficients correspond to different types of aberration patterns (e.g., coma aberration, 3-foil and 5-foil aberration).

Referring again to FIG. 1, the other components shown in system 100 assist in determining the quality of the lens in the photolithography tool 104. For instance, the photolithography simulation tool 106 is operable to calculate the sensitivity of different overlay patterns to different types of aberration. As described in more detail in association with FIG. 14, sensitivity coefficients are used in the calculation of Zernike coefficients. In the illustrated embodiment, the simulation tool 106 may comprise a computer that may be a conventional, commercially-available computer, or any other suitable computer hardware. The hardware of the simulation tool 106 may include a processor and a non-transitory memory. The memory stores computer-readable instructions that are executed by the processor to simulate photolithography processes. In some embodiments, the simulation tool 106 may be a software module executing on a computing hardware resource.

The overlay metrology tool 108 is operable to measure characteristics of patterns on wafers exposed by the photolithography tool 104. For instance, the overlay metrology tool 108 may be operable to measure the distance between features of patterns exposed on a wafer. When used in conjunction with an overlay pattern exposed on a wafer by a monitor photomask (i.e., a photomask used for testing purposes), tool 108 may measure overlay error, which may be used to quantify lens quality. As shown in FIG. 1, the system 100 also includes the data processing tool 110. In the illustrated embodiment, the data processing tool is a computer including a processor and non-transitory memory and is operable to process, analyze, and format overlay error data collected by the overlay metrology tool 108. In some embodiments, the simulation tool 106 and data processing tool 110 may be software modules executing on a shared computing resource.

As mentioned above, the system 100 includes the database 112, which may be of a type known in the art. In the illustrated embodiment the database 112 is operable to store lens aberration/quality data of the photolithography tool 104. Cross-slit aberration, and thus quality, of a lens may drill over time and so it may be useful to compare historical aberration data for a lens against recently collected aberration data.

Figure 2:
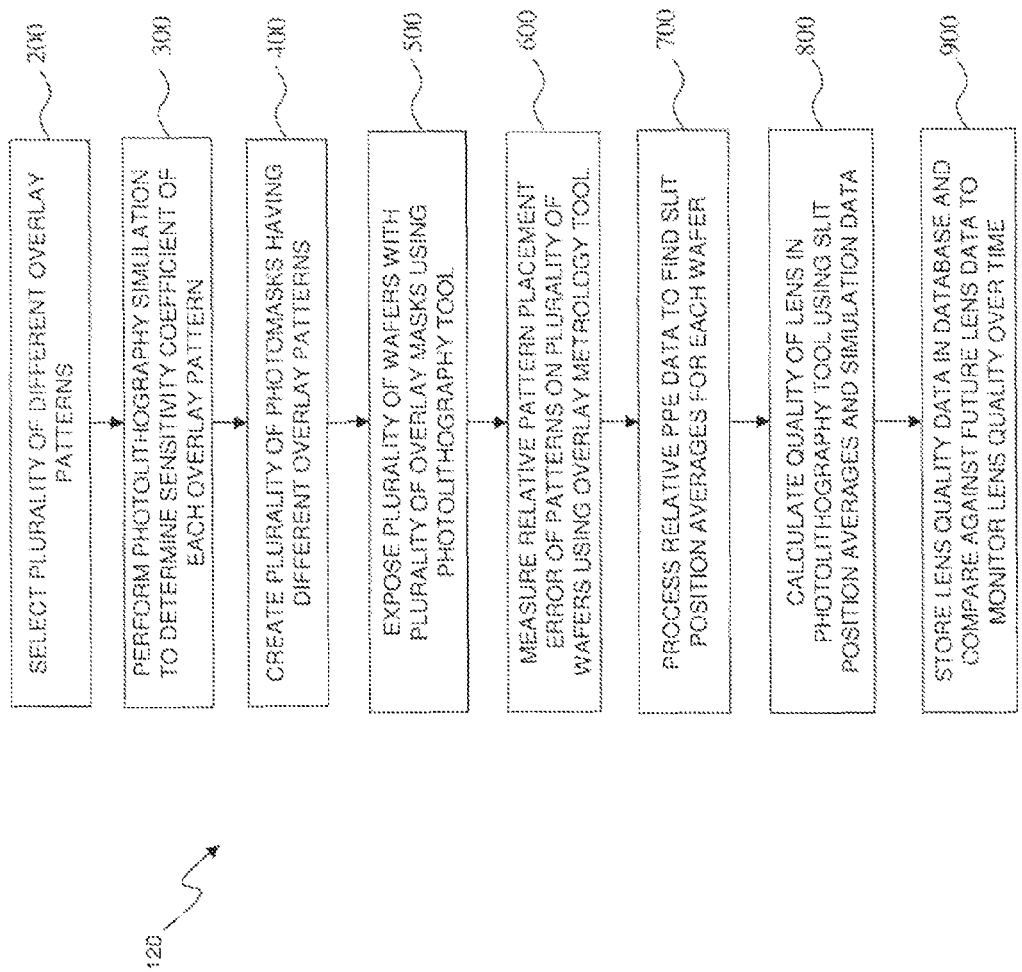
FIG. 2 is a flowchart of a method for characterizing the quality of a lens in a photolithography tool.

Referring now to FIG. 2, illustrated is a flowchart of a method 120 for characterizing the quality of a lens in photolithography tool 104. The method 120 in FIG. 2 is a high-level overview and details associated with each block in the method will be described in association with the subsequent figures in the present disclosure.

Figure 3:
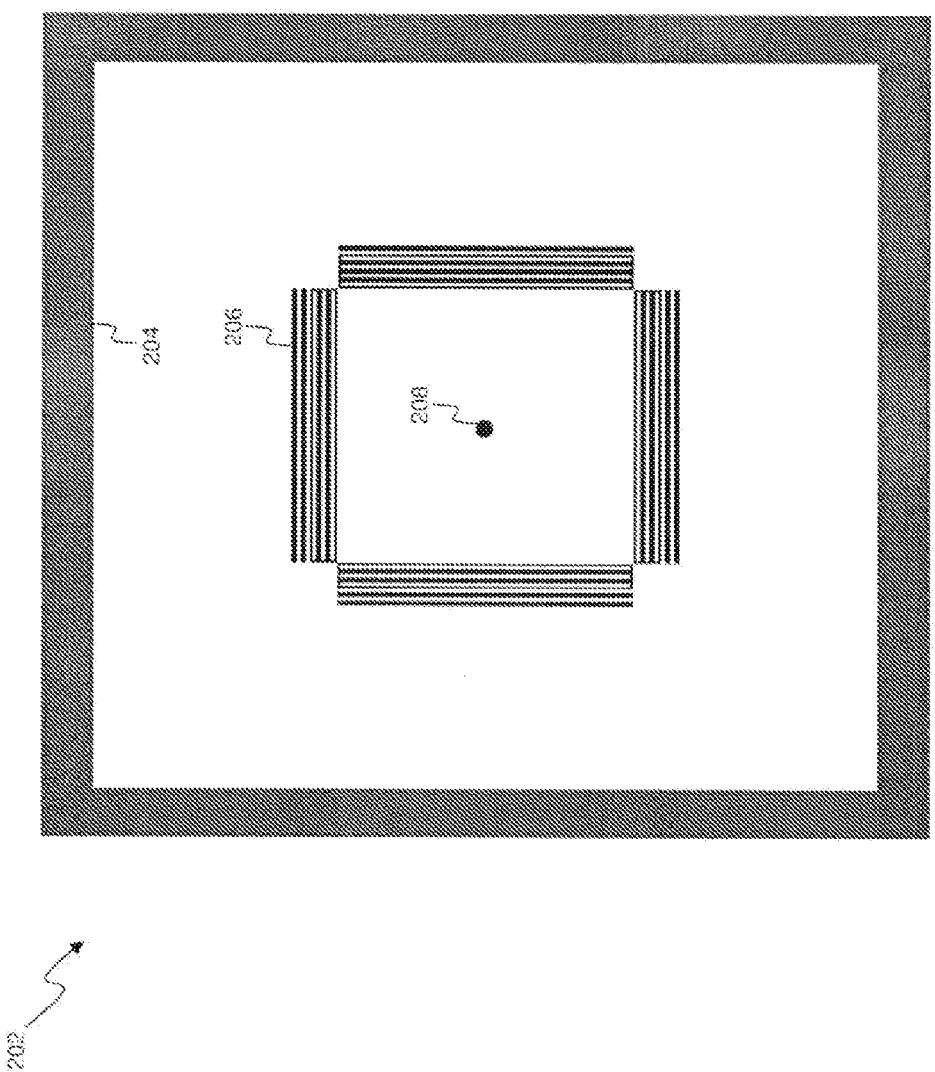
FIG. 3 is a one example of an overlay pattern according to various aspects of the present disclosure.

The method 120 begins at block 200 where a plurality of different overlay patterns are selected. Overlay patterns (sometimes referred to as overlay marks) may be used to test the exposure accuracy of a photolithography tool. For instance, a wafer may be exposed using a monitor photomask having an overlay pattern instead of a circuit design for quality assessment purposes. The pattern exposed on the wafer may then be measured to determine the overlay error or relative pattern placement error (PPE) associated with the lens of the photolithography tool used to perform the exposure. In this regard, FIG. 3 is a one example of an overlay pattern 202. The overlay pattern 202 is known as a box-in-box pattern. Specifically, the overlay pattern 202 includes an outer box 204 that is formed by a single opaque line. The overlay pattern 202 further includes an inner box 206 that is formed of two vertically-oriented gratings and two horizontally-oriented gratings. Each grating includes a plurality of spaced opaque lines of substantially the same width that are equidistant from each other. In one embodiment, the gratings of the inner box 206 may have a line width of 500 nm and pitch of 1000 nm, but, in alternative embodiments, the gratings may have different line widths and/or pitches. As shown in the illustrated embodiment, the inner box 206 has a different pitch than the outer box 204. Notably, the pattern that forms inner box 206 may have a different sensitivity to lens aberration than the pattern that forms outer box 204 due to the difference in the pitch of the patterns. In alternative embodiments, the outer box 204 may include a plurality of parallel opaque lines of substantially the same width (i.e. a grating structure). In further alternative embodiments, an inner box may be formed of a single opaque line and the outer box may be formed of a plurality of gratings. In these alternative embodiments, the features of the outer box 204 would have a different pitch than the features of the inner box 206. Additionally, as indicated by the circle 208, the center of the inner box 206 is aligned with the center of the outer box 204. That is, the inner box 206 and outer box 204 have the same center point. When the pattern 202 is transferred onto a wafer, however, the center point of the exposed inner box may "shift" with respect to the center point of the exposed outer box. For the purposes of the present disclosure, the displacement between the centers is defined as the overlay error or relative pattern placement error (PPE).

Figure 4:
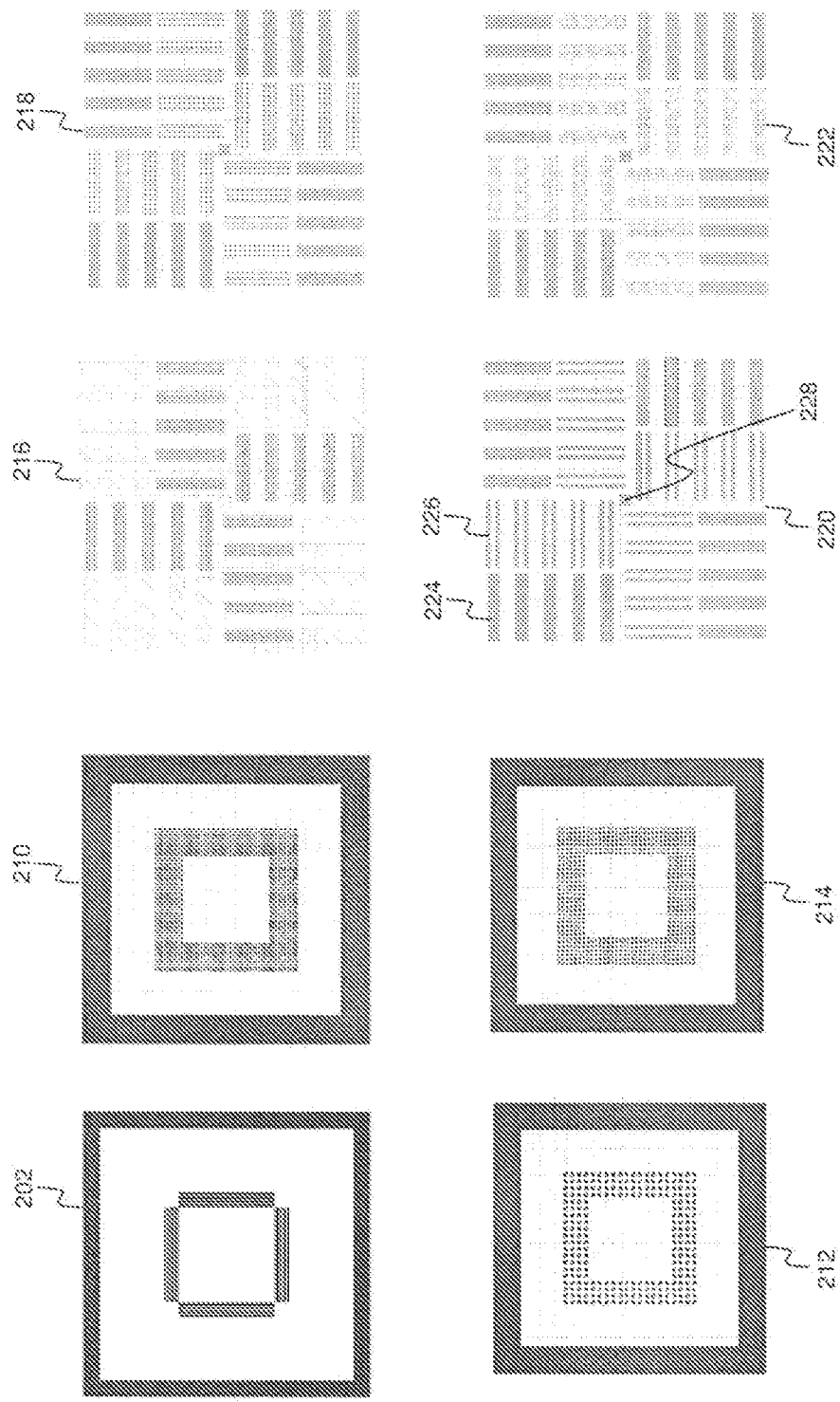
FIG. 4 illustrates eight different example overlay patterns according to various aspects of the present disclosure.

As mentioned above, at block 200 in method 120, a plurality of different overlay patterns are selected. FIG. 4 illustrates eight such overlay patterns that may be selected. As shown, each overlay pattern 202, 210, 212, 214, 216, 218, 220, and 222 includes multiple features having different attributes (e.g., line width, pitch, etc). Like overlay pattern 202 of FIG. 3, overlay patterns 210, 212, and 214 are box-in-box patterns. And, in each pattern 210, 212, and 214, the inner box has a different pitch than the outer box. Further, overlay patterns 216, 218, 220, and 222 include alternating bar features. For example, pattern 220 includes a bar 224 that is formed by an unbroken opaque line and a bar 226 that is formed by a grating having a plurality of spaced opaque lines of substantially the same width that are equidistant from each other. The bar 224 has a different pitch than the bar 226. All of the bars similar to bar 224 form a first pattern feature centered around center 228. Similarly, the bars similar to bar 226 form a second pattern feature that is also centered around center 228. That is, the first and second pattern features share a center point. The patterns 216, 218, and 222, also include two different bars types with two different pitches. As will be described in more detail below, the method 120 may utilize the eight different overlay patterns shown in FIG. 4 to accurately characterize the quality of the lens in photolithography tool 104. It is understood that the test patterns shown in FIG. 4 are simply examples, and, in alternative embodiments, different patterns having different features may be selected, and a different number of patterns may be selected.

Figure 5:
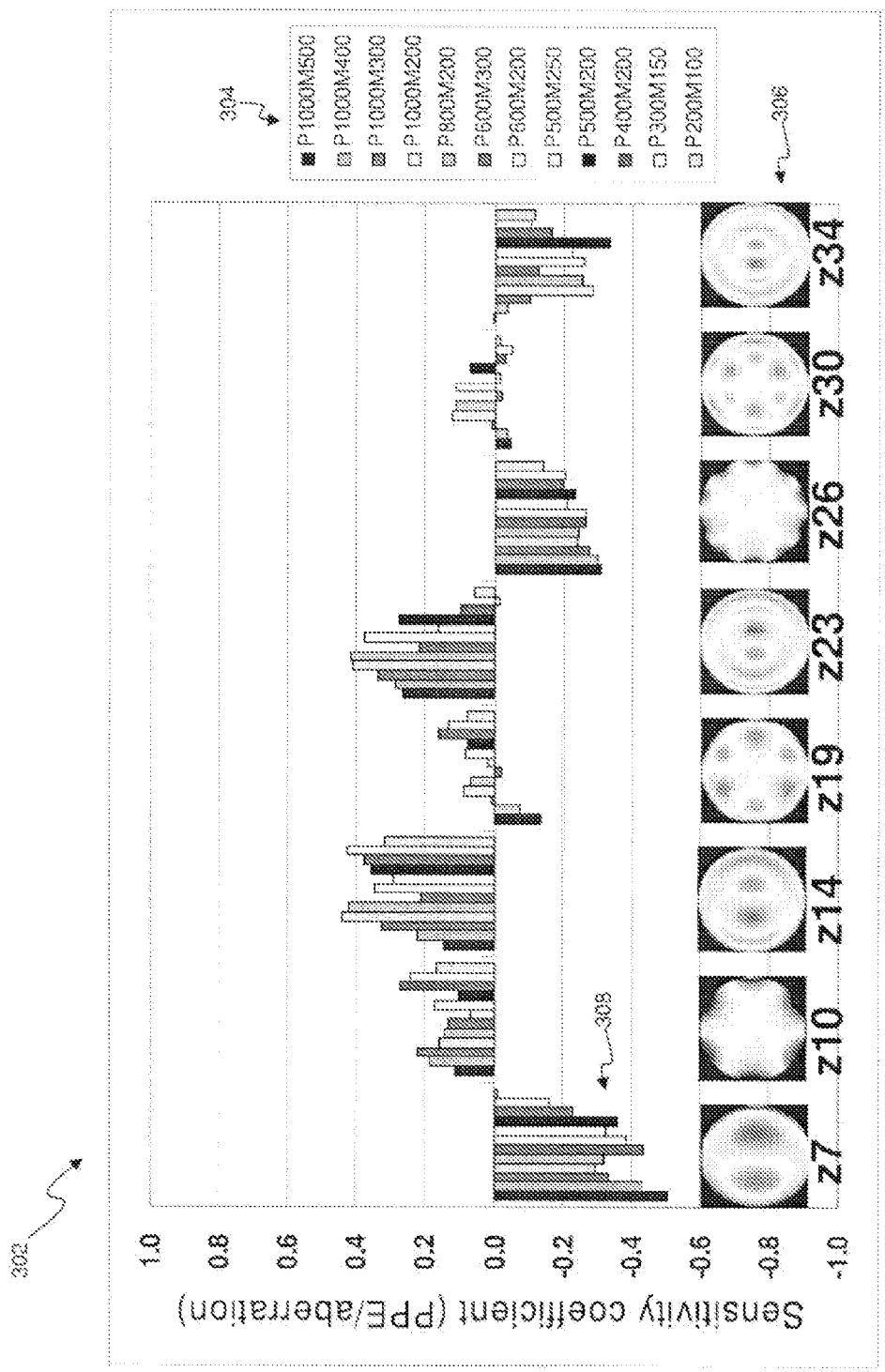
FIG. 5 illustrates example results of a photolithography simulation of the exposure of different overlay patterns by photolithography lenses exhibiting different types of aberration patterns.

Referring back to FIG. 2, the method 120 proceeds to block 300 where a photolithography simulation is performed with photolithography simulation tool 106 to determine sensitivity coefficients for the overlay patterns selected in block 200. In general, an overlay pattern's sensitivity coefficient describes that pattern's sensitivity to lens aberration. More specifically, as used in the present disclosure, a pattern's sensitivity coefficient is defined as the amount of pattern placement error (in nanometers) produced by one nanometer of lens aberration. Further, a pattern may have a different sensitivity coefficient for different aberration patterns, as represented by the Zernike coefficients. The photolithography simulation tool 106 is operable to simulate the exposure of different overly patterns by photolithography lenses exhibiting different types of aberration patterns. In that regard, FIG. 5 illustrates example simulation results in a bar graph 302 for twelve different patterns 304 and eight different Zernike aberration patterns 306. As shown in FIG. 5, sensitivity coefficients 308 were generated by simulation for each pattern 304 using each of eight aberration patterns 306. For example, the example bar graph 302 shows that a pattern with a pitch of 1000 nm and a line width of 500 nm has a sensitivity coefficient of −0.5 for the left-right imbalance aberration pattern represented by the Zernike coefficient $Z_7$. In the block 300 of method 120, the photolithography simulation tool 106 generates sensitivity coefficients associated with the Zernike coefficients $Z_7$, $Z_{10}$, $Z_{14}$, $Z_{19}$, $Z_{23}$, $Z_{26}$, $Z_{30}$, and $Z_{34}$, for each of the eight overlay patterns shown in FIG. 4. The types of aberration represented by these Zernike coefficients are those that affect the types of overlay patterns shown in FIG. 4. It is understood that the simulation results shown in bar graph 302 are just an example. In alternative embodiments that utilize different overlay patterns, sensitivity coefficients may be generated using different aberration patterns (i.e., Zernike coefficients). Further, a pattern's sensitivity coefficient may be defined in an alternate manner.

Figure 6:
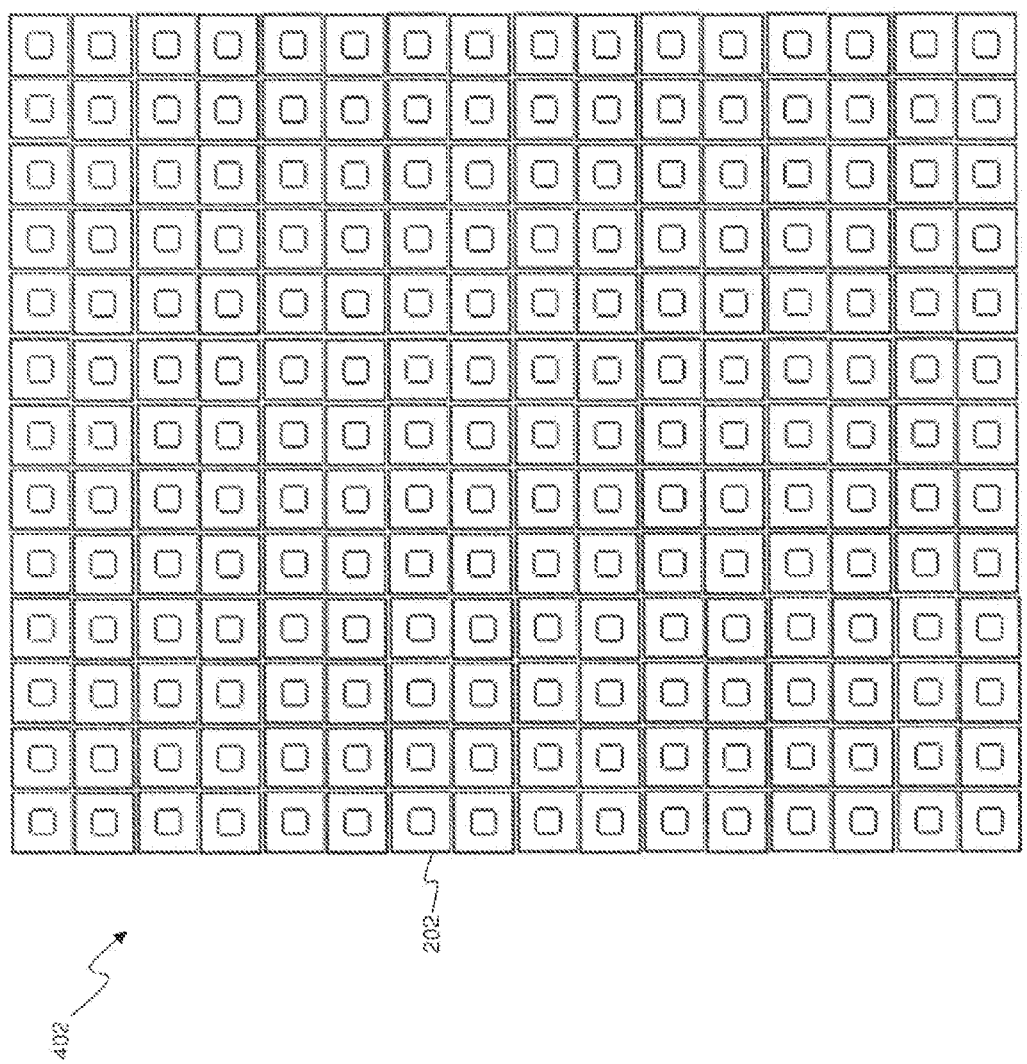
FIG. 6 is an Illustration of a photomask having the overlay pattern shown in FIG. 3 thereon.

After the sensitivity coefficients have been generated for the eight overlay patterns, method 120 proceeds to block 400 where a monitor photomask is created for each of the overlay patterns. FIG. 6 is an illustration of a photomask 402 having the overlay pattern 202 shown in FIG. 3 thereon. Specifically, on photomask 402, the pattern 202 is repeated 208 times in a grid having 13 columns and 16 rows. As mentioned above, exposure slit in the photolithography tool 104 is as wide as a photomask; thus, when the photomask 402 is aligned beneath the exposure slit, light will be directed through a row of 13 overlay patterns. And, when the photomask is scanned from top to bottom under the exposure slit, 16 rows of 13 patterns will be sequentially formed in an exposure field on a wafer. In the illustrated embodiment of method 120, each of the eight photomasks will have a 13 by 16 grid of the same pattern, where each photomask is associated with a different one of the patterns shown in FIG. 4. It is understood that in alternative embodiments, the photomask 402 may be configured in a different manner. For instance, a pattern may by repeated a different number of times on the photomask, or multiple different patterns may be formed on a single photomask.

Figure 7:
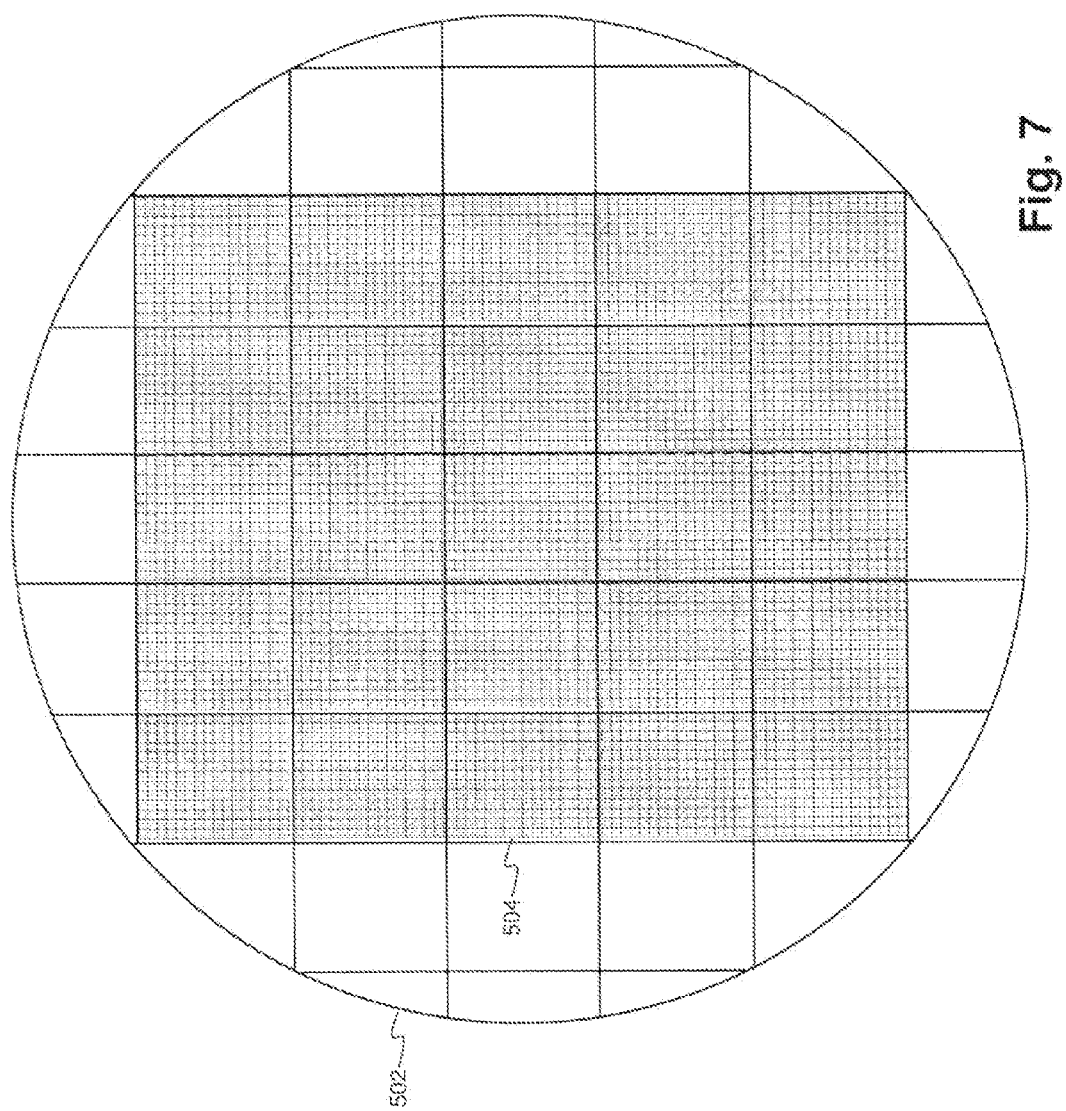
FIG. 7 illustrates a wafer that has been exposed by a photolithography tool using the photomask shown in FIG. 6.

Referring back to FIG. 2, the method 120 next proceeds to block 500 where the photolithography tool 104 is used to expose eight wafers, where each wafer is exposed with a different photomask having a different pattern. As a result, each overlay patient will be formed on a respective one of the eight wafers. For example, FIG. 7 illustrates a wafer 502 that has been exposed by photolithography tool 104 with the photomask 402 shown in FIG. 6. Specifically, the photolithography tool 104 projects light through the exposure slit and, as photomask 402 is scanned beneath the slit, rows of 13 patterns are simultaneously created in a field on the wafer 502. Accordingly, each exposed field on wafer 502, such as a field 504, contains the pattern on photomask 402. As shown in FIG. 7, twenty-five fields of the wafer 502 are exposed with the photomask 402. That is, after exposure, each field includes 208 copies of the overlay pattern 202 and the wafer includes 5200 copies of the pattern 202 in total. Each of the eight wafers are similarly exposed. In alternative embodiments, a different number of fields on a wafer may be exposed, multiple patterns may be exposed on a single wafer, and a different number of wafers may be exposed.

Figure 8:
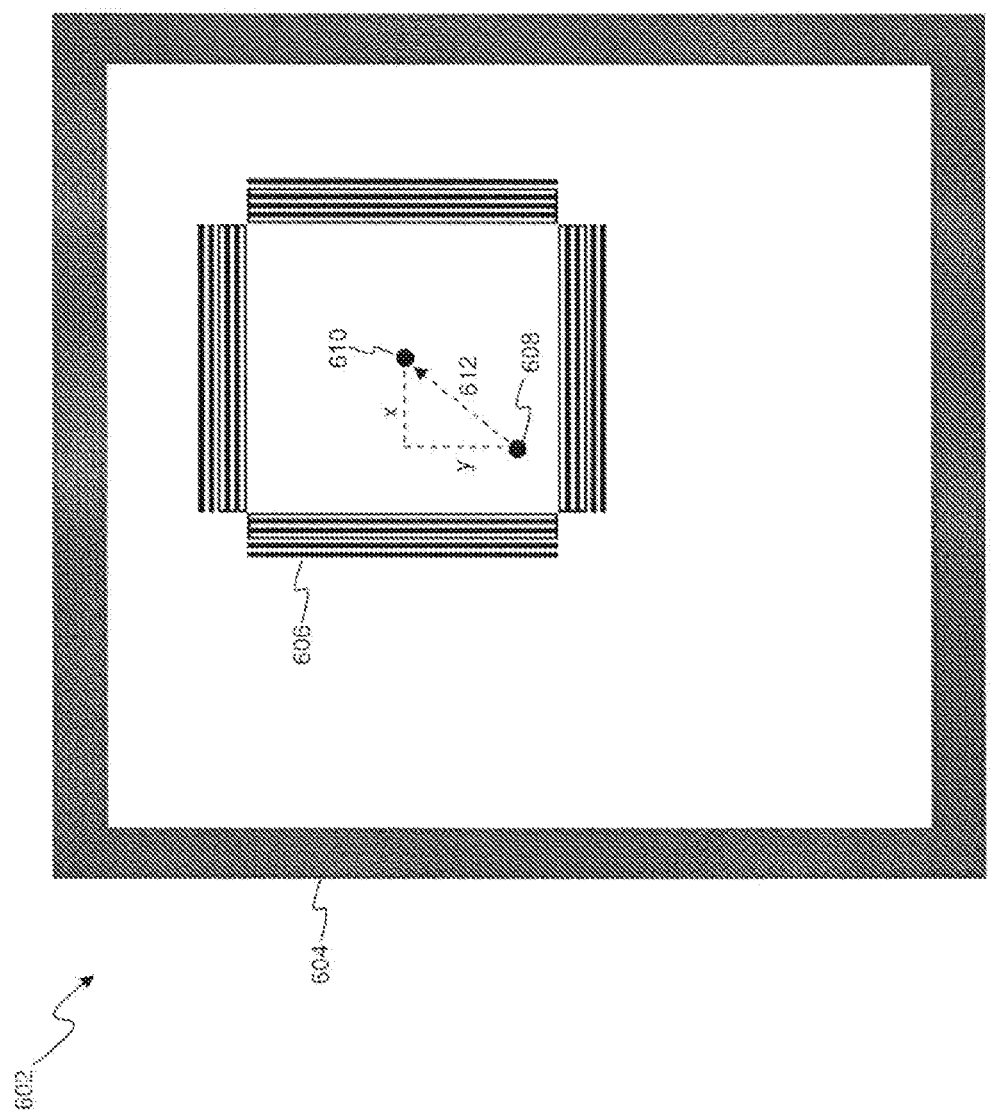
FIG. 8 illustrates an example overlay error of an overlay pattern formed on a wafer.

After the eight overlay patterns have been exposed onto eight wafers, the method 120 of FIG. 2 proceeds to block 600 where the overlay metrology tool 108 is used to measure the overlay errors of the patterns exposed on the eight wafers. FIG. 8 illustrates an example overlay error of one of the copies of pattern 202 exposed on the wafer 502. As shown, an exposed overlay pattern 602 includes an outer box 604 and an inner box 606. The individual structures of the exposed outer box 604 and the exposed inner box 606 are substantially the same as the outer box 204 and inner box 206 of overlay pattern 202. However, when the pattern on the photomask is exposed onto the wafer, the inner box is displaced some amount from its intended position (i.e., its pattern placement error) and the outer box is displaced a different amount from its intended position. In some instances, the pattern placement errors for the two features may be different because of the difference in pitch between the two features. Thus, when the displacement amounts are different for the two features, as is the case in the exposed pattern 602 in FIG. 8, the exposed inner box 606 looks to have shifted relative to the exposed outer box 604 when compared to the boxes' intended relative placement (i.e., the boxes have the same center point as shown pattern 202 of FIG. 3). In the illustrated embodiment, this relative shift is called the relative pattern placement error (PPE) and is measured by a distance and direction between a center 608 of the outer box 604 and a center 610 of the inner box 606.

Typically, relative PPE is quantified by a vector. Here, the exposed pattern 602 has a PPE vector 612 that indicates both the direction and distance of the relative PPE between the two centers. The PPE vector 612 has an x-component that represents the horizontal component of the relative PPE and a y-component that represents the vertical component of the relative PPE. Relative pattern placement error is measured in the same way for alternating bar patterns, such as the patterns 216, 218, 220, and 222 shown in FIG. 4. That is, the position of the center of one alternating bar pattern feature is compared to the position of the center of the other alternating bar pattern feature. The relative direction and distance between them is represented by a PPE vector. As mentioned above, the overlay metrology tool 108 is used to measure the relative PPE of every overlay pattern on each wafer. In other words, in the illustrated embodiment, the tool 108 determines 208 relative pattern placement errors for each field on a wafer (i.e. one for each individual pattern) and 5200 relative pattern placement errors for each wafer. Each of the eight wafers are inspected by the overlay metrology tool 108 in block 600 of method 120. It is understood that in alternative embodiments, the overlay errors of the patterns on the exposed wafers may be measured and quantified in a different manner. For instance, the distance between different portions of the box-in-box or alternating bar patterns may be measured by an overlay metrology tool.

Figure 9:
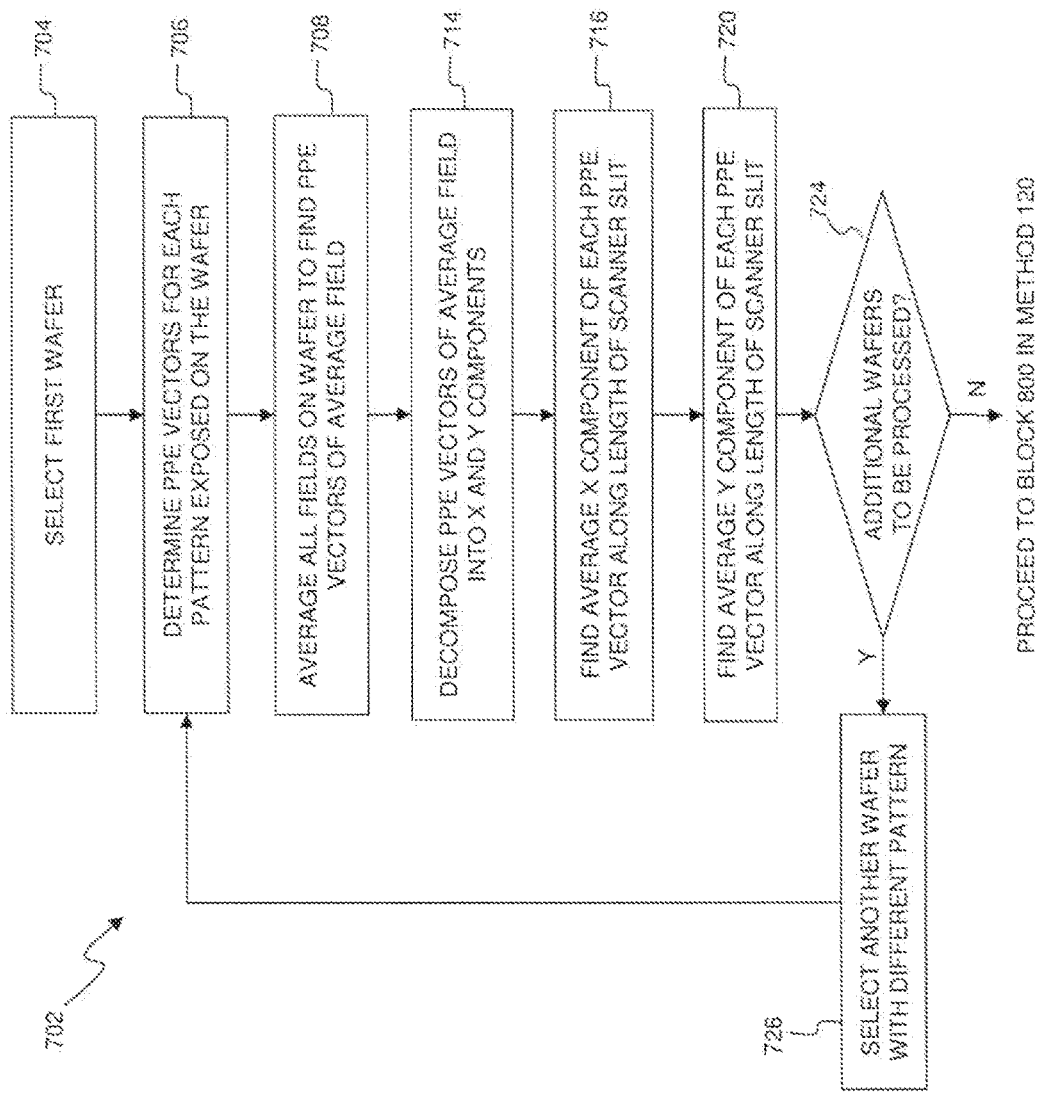
FIG. 9 is a flow-chart of a method of processing relative pattern placement error data collected by an overlay metrology tool.
Figure 10:
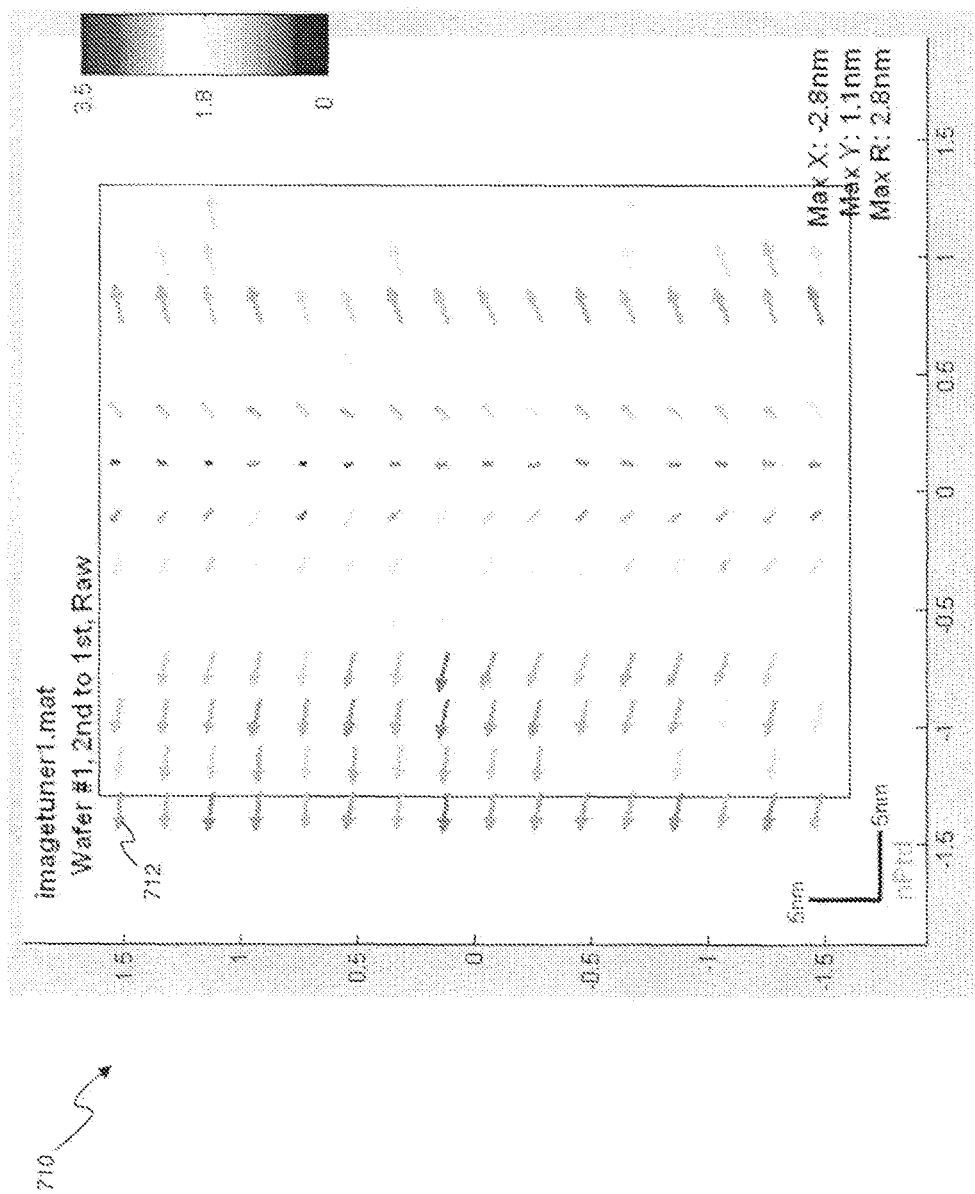
FIG. 10 is an example average field having 208 average pattern placement error vectors.

Referring back to FIG. 2, the method 120 next proceeds to block 700 where the data processing tool 110 processes and analyzes the relative PPE data collected by the overlay metrology tool 108 in block 600. In that regard, FIG. 9 is a flow-chart of a method 702 of processing relative PPE data collected by the overlay metrology tool 108 in block 600. The method 702 begins at block 704 where a first wafer is select out of the eight exposed wafers. The method 702 then proceeds to block 706 where the data processing tool 110 calculates the PPE vectors for each individual pattern on the wafer (i.e., 208 PPE vectors per field and 5200 PPE vectors per wafer). Then, in block 708, the processing tool 110 calculates an "average" field on the selected wafer using the PPE vector data front all 25 fields on the wafer. Specifically, for each of the 208 individual patterns in a field, the processing tool 110 calculates the average PPE vector associated with that pattern across the 25 fields. FIG. 10 is an example average field 710. The average field 710 includes 208 PPE vectors that each represent an average PPE vector associated with an individual pattern. For instance, a PPE vector 712 is the average PPE vector for the overlay pattern in the top left-most position of each field on a wafer. Calculating an average field reduces the impact of any metrology errors introduced by the overlay metrology tool 108. The method 702 then proceeds to block 714 where the processing tool 110 decomposes the PPE vectors in the "average" field of the selected wafer into their x-components and y-components (see FIG. 8). Next, in block 716, the processing tool 110 utilizes the x-component data to calculate an average x-component for each of the 13 columns of PPE vectors in the average field 710. As mentioned above, the exposure slit in photolithography toot 104 is as wide as the pattern on an overlay photomask and a photomask's pattern is projected onto one field on a wafer; thus, each column in the average field 710 represents a specific position along the length of the exposure slit. Therefore, the 13 average x-components of PPE vectors represent the amount of horizontal relative PPE associated with 13 positions along the exposure slit. FIG. 11 illustrates an example line graph 718 depicting these 13 average x-components of PPE vectors calculated by the processing tool 110 in block 716. The y-axis of the graph 718 represents the size of the x-component of a PPE vector (in nm), and the x-axis represents positions along the length of the exposure slit (in cm). For instance, at a position −125 cm to the left of center on the exposure slit, the lens of the photolithography tool 104 produces, on average, 0.4 nm of horizontal relative PPE for the pattern on the selected wafer. In this manner, "cross-slit" lens aberration may be quantified. The method 702 then proceeds to block 720 where the processing tool 110 utilizes the PPE vector y-component data to calculate an average y-component for each of the 13 columns of PPE vectors in the "average" field 710. This is performed in the same manner as the calculation of the average x-components in block 716. FIG. 12 illustrates an example line graph 722 depicting 13 average y-components of PPE vectors calculated by the processing tool 110 in block 720. The x-axis of line graph 722 again represents positions along the exposure slit, but the y-axis represents the size of the y-component of a PPE vector.

The method 702 then proceeds to decision block 724 where it is determined whether overlay error data associated with additional wafers need to be processed. If so, another wafer is selected in block 726 and the method returns of block 706. When the overlay error data for data all eight wafers has been processed, the processing tool will have produced eight sets of cross-slit PPE vector x-component data and eight sets cross-slit PPE vector y-component data. In some embodiments, these sets of data may be plotted on line graphs similar to the line graphs 718 and 722 for analysis purposes. After overlay error data processing for all eight exposed wafers has been completed, the method 702 is complete and thus block 700 in method 120 of FIG. 2 is complete. It is understood that the overlay error data collected by the overlay metrology tool may be processed in a number of different ways, and the method described in the illustrated embodiment is simply an example. Further, in some embodiments, the method 702 may include additional steps and/or the current steps may be performed in a different order depending on the manner in which the overlay error data is processed.

Figure 13:
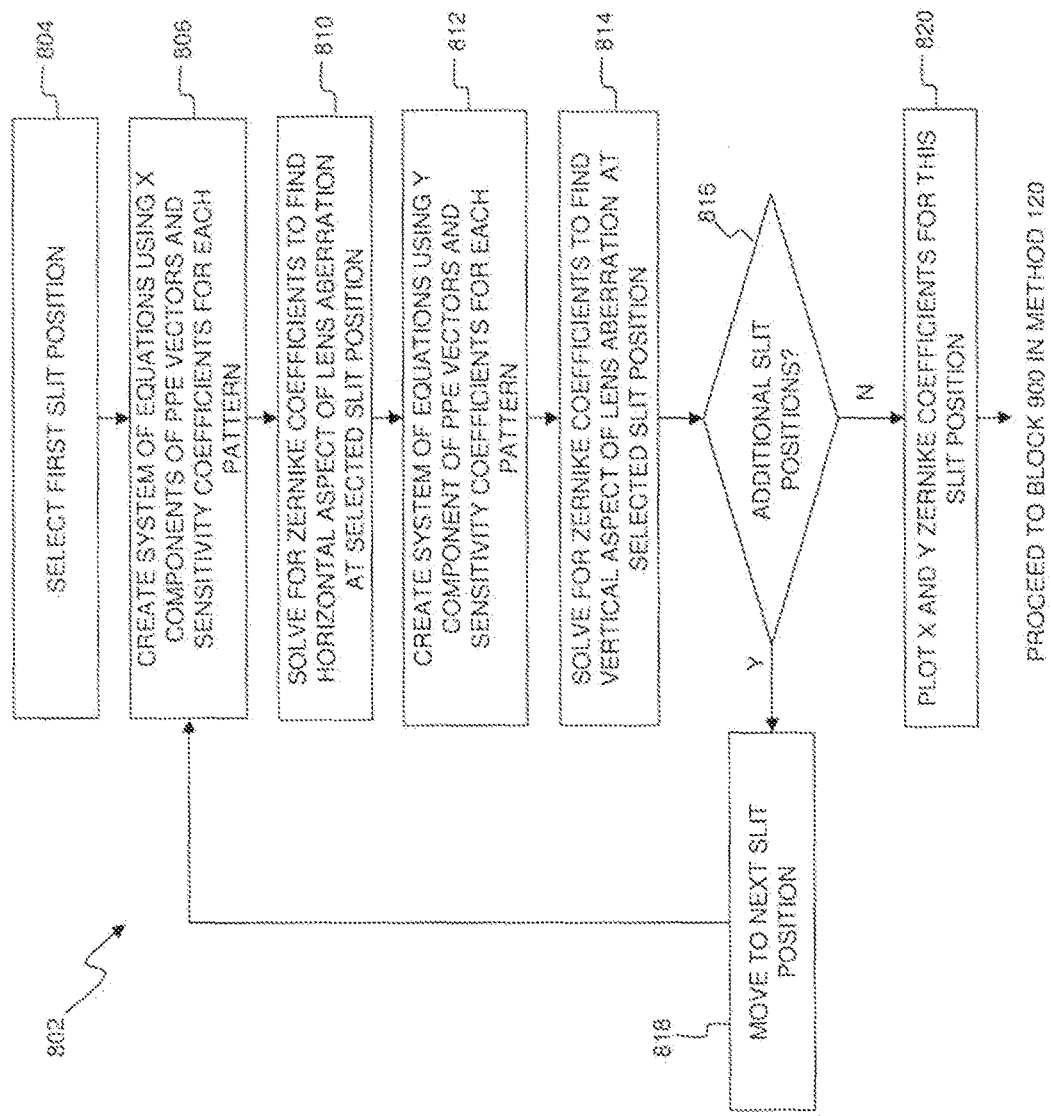
FIG. 13 illustrates a flow chart of a method for calculating the quality of a lens in a photolithography tool in terms of Zernike coefficients.

Next, the method 120 proceeds to block 800 where the overlay error data processed in block 700 is used to calculate the quality of the lens in the photolithography lens in terms of Zernike coefficients. Typically, a lens with a large Zernike coefficient is more imperfect than a lens with a small Zernike coefficient. In other words, a Zernike coefficient associated with a lens is a quality indicator for that lens. In the illustrated embodiment, the data processing tool 110 may carry out these calculations. In that regard. FIG. 13 illustrates a flow chart of a method 802 for calculating the quality of the lens in the photolithography tool in terms of Zernike coefficients as carried out in block 800 of method 120. Method 802 begins at block 804 where a first slit position along the length of the exposure slit is chosen. As mentioned above, relative PPE data is collected at 13 positions along the length of the exposure slit because each position is associated with an overlay pattern on a photomask. And, in block 700 of method 120, average x and y-components of PPE vectors are calculated at each of the 13 slit positions for all eight wafers. The method 802 proceeds to block 806 where a system of Zernike polynomial equations is setup to find the Zernike coefficients describing the horizontal aspect of lens aberration in the photolithography lens at the selected slit position. In more detail, FIG. 14 illustrates a system of Zernike polynomial equations 808 that may be used to calculate the quality of a photolithography lens in terms of eight Zernike coefficients. The variables $OVL_x(1)$ through $OVL_x(8)$ represent the average PPE vector x-component for each of the eight exposed wafers at a selected slit position. The variables $S_7(1)$ through $S_7(8)$ represent the sensitivity coefficients for the $Z_7$ aberration pattern for each of the eight overlay patterns exposed on the eight wafers. These sensitivity coefficients were calculated by the photolithography simulation tool 106 in block 300 of the method 120. To find the eight Zernike coefficients associated with the lens in the x-direction at the selected slit position, the PPE vector x-components for each wafer at the selected slit position (eight values) are plugged into the equation as the $OVL_x(1)$ through $OVL_x(8)$ variables, and the sensitivity coefficients associated with the eight overlay patterns for each of the eight aberration patterns (64 total values) are plugged into the equation system 808. As a result, system 808 includes eight equations each having eight unknowns (i.e. the Zernike coefficients $Z_7, Z_{10}, Z_{14}, Z_{19}, Z_{23}, Z_{26}, Z_{30}$). The method 802 then proceeds to block 810 where the eight Zernike coefficients are solved for. The resulting Zernike-coefficients describe the horizontal aspect of lens aberration in the photolithography lens at the selected slit position. For example, the $Z_7$ Zernike coefficient solved for in this block represents the amount of horizontal aberration of the $Z_7$ aberration type exhibited by the photolithography tool's lens at the select slit position.

The method 802 then proceeds to block 812 where a system of Zernike polynomial equations is setup to End the Zernike coefficients describing the vertical aspect of lens aberration in the photolithography tool's lens at the selected slit position. This system of Zernike polynomial equations is generated in the same manner as that described in association with block 806; however, the PPE vector y-component data for the selected slit position is plugged into $OVL_y(1)$ through $OVL_y(8)$ variables (corresponding to the eight overlay patterns) on the left side of the system 808. The same sensitivity coefficients as used in block 806 are plugged into the system 808. After the system of equations for the vertical aspect of lens aberration is generated, the method 802 moves to block 814 where the eight Zernike coefficients are solved for. The resulting Zernike coefficients describe the vertical aspect of lens aberration in the photolithography lens at the selected slit position. For example, the $Z_7$ Zernike coefficient solved for in this block represents the amount of vertical aberration of the $Z_7$ aberration pattern exhibited by the photolithography tool's lens at the select slit position.

The method 802 next moves to decision block 816 where it is determined whether Zernike coefficients for additional exposure slit positions need to be solved for. If so, the method proceeds to block 818 where the next slit position is selected along the length of the exposure slit, and then returns to block 806. If Zernike coefficients associated with every slit position along the exposure slit (i.e., 13 positions in the illustrated embodiment), the method 802 proceeds to optional block 820 where the Zernike coefficient values for each aberration pattern may be plotted for analysis purposes. In the illustrated embodiment, the solved-for Zernike coefficients may be plotted on line graphs such, as those illustrated in FIGS. 15 and 16. An example line graph 812 illustrates the $Z_7$ Zernike coefficients associated with each of the 13 slit positions. The triangular data points represent the Zernike coefficients associated with the horizontal aspect of lens aberration and the circular data points represent the Zernike coefficients associated with the vertical aspect of lens aberration. An example line graph 814 is similar to the line graph 812 but illustrates the $Z_{10}$ Zernike coefficients corresponding to each of the 13 exposure slit positions. Line graphs for the remaining calculated Zernike coefficients (i.e. $Z_{14}, Z_{19}, Z_{23}, Z_{26}, Z_{30}$) may also be created for analysis purposes. In this manner, the cross-slit lens aberration of the photolithography tool's lens for eight different aberration types may be visualized. It is understood that the above disclosure of solving for Zernike coefficients is simply an example, and alternative methods may be utilized to transform overlay error data into meaningful lens aberration characterization data. Further, visualization means other than line graphs may be used to plot the Zernike coefficient data. Additionally, in some embodiments, the method 802 may include additional steps and/or the current steps may be performed in a different order depending on the manner in which lens aberration is characterized.

Referring back to FIG. 2, the method 120 next proceeds to block 900 where the lens aberration characterization data may be stored in the database 112 in system 102. In some embodiments, the lens aberration data may be used to calibrate the photolithography tool 104 so that overlay error is reduced. Further, aberration characteristics of a photolithography lenses may drift over time, and thus it may be helpful to compare current lens aberration data against historical data. Additionally, in some embodiments, the method 120 may include additional steps and/or the current steps may be performed in a different order depending on the specific manner in which lens aberration is characterized.

Although the method 120 of generating lens aberration characterization data was described in the context of a single photolithography tool, it may be applied across a plurality of tools in a fabrication facility. And, when characterizing the quality of multiple photolithography tools, efficiencies may be achieved using the above method versus prior methods. For instance, the same set of overlay photomasks may be used to expose test wafers on multiple tools. The resultant lens aberration data may be compared to characterize the difference in lens quality between the multiple photolithography tools. And, because the overlay photomasks of the present disclosure are include multiple-different patterns on the same mask (i.e. Inner box and outer box having different pitches) photolithography tool time required for lens characterization is reduced. Additionally, in alternative embodiments, the method 120 in FIG. 2 may be modified to characterize only one type of aberration of a photolithography lens, such as the aberration pattern represented by the $Z_7$ Zernike coefficient. In such an embodiment, only a single overlay pattern would need to be selected and simulated to find its sensitivity coefficient associated with the aberration pattern. In turn, only a single overlay photomask having the overlay pattern would need to be created to expose the pattern onto a wafer. After measuring the overlay error/relative PPE, only a single Zernike polynomial equation would be needed to solve for a single Zernike coefficient. Further, in some alternative embodiments, photolithography lens aberration may be characterized by means other than Zernike coefficients.

One of the broader forms of the present disclosure involves a method of characterizing photolithography lens quality. The method includes selecting an overlay pattern having a first feature with a first pitch and a second feature with a second pitch different than the first pitch, performing a photolithography simulation to determine a sensitivity coefficient associated with the overlay pattern, and providing a photomask having the overlay pattern thereon. The method also includes exposing, with a photolithography tool, a wafer with the photomask to form the overlay pattern on the wafer, measuring a relative pattern placement error of the overlay pattern formed on the wafer, and calculating a quality indicator for a lens in the photolithography tool using the relative pattern placement error and the sensitivity coefficient.

Another one of the broader forms of the present disclosure involves a method of characterizing photolithography lens quality. The method includes selecting first and second different overlay patterns, each of the first and second overlay patterns having a first feature with a first pitch and a second feature with a second pitch different than the first pitch. The method further includes performing a photolithography simulation to determine a first sensitivity coefficient for the first overlay pattern and a second sensitivity coefficient for the second overlay pattern, the first and second sensitivity coefficients being respectively associated with a first lens aberration pattern represented by a first Zernike coefficient and a second lens aberration pattern represented by a second Zernike coefficient different than the first Zernike coefficient. Additionally, the method includes providing first and second photomasks, the first photomask having the first overlay pattern thereon and the second photomask having the second overlay pattern thereon and exposing, with a photolithography tool, first and second wafers with the first and second photomasks to form the first overlay pattern on the first wafer and the second overlay pattern on the second wafer. The method further includes measuring a first relative pattern placement error of the first overlay pattern formed on the first wafer and measuring a second relative pattern placement error of the second overlay pattern formed on the second wafer, and, finally, solving a system of Zernike polynomial equations using the first and second relative pattern placement errors and the first and second sensitivity coefficients to determine values for the first and second Zernike coefficients.

Yet another of the broader forms of the present disclosure involves a system that includes a photolithography simulation tool configured to determine a sensitivity coefficient associated with an overlay pattern having a first feature with a first pitch and a second feature with a second pitch different than the first pitch. The system also includes a photolithography tool having a lens and an exposure slit, the photolithography tool configured to direct radiation from the exposure slit through a photomask having the overlay pattern thereon and onto a wafer to form the overlay pattern on the wafer. Additionally, the system includes an overlay metrology tool configured to measure a relative pattern placement error of the overlay pattern formed on the wafer and a data processing tool configured to calculate a quality indicator for the lens in the photolithography tool using the relative pattern placement error and the sensitivity coefficient.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of characterizing photolithography lens quality, comprising:

selecting first and second different overlay patterns, each of the first and second overlay patterns having a first feature with a first pitch and a second feature with a second pitch different than the first pitch;

performing a photolithography simulation to determine a first sensitivity coefficient for the first overlay pattern and a second sensitivity coefficient for the second overlay pattern, the first and second sensitivity coefficients being respectively associated with a first lens aberration pattern represented by a first Zernike coefficient and a second lens aberration pattern represented by a second Zernike coefficient different than the first Zernike coefficient;

providing first and second photomasks, the first photomask having the first overlay pattern thereon and the second photomask having the second overlay pattern thereon;

exposing, with a photolithography tool, first and second wafers with the first and second photomasks to form the first overlay pattern on the first wafer and the second overlay pattern on the second wafer;

measuring a first relative pattern placement error of the first overlay pattern formed on the first wafer and measuring a second relative pattern placement error of the second overlay pattern formed on the second wafer; and solving a system of Zernike polynomial equations using the first and second relative pattern placement errors and the first and second sensitivity coefficients to determine values for the first and second Zernike coefficients.

2. The method of claim 1, wherein the first feature and the second feature on each overlay pattern have the same center point; and wherein measuring the first and second relative pattern placement errors of the first and second overlay patterns formed on the first and second wafers includes measuring a displacement between a center point of the first feature and a center point of the second feature on each of the first and second wafers.

3. The method of claim 2, wherein the first and second relative pattern placement errors are vectors having horizontal component values and vertical component values.

4. The method of claim 1, wherein the first sensitivity coefficient represents a ratio of an amount of pattern placement error that is produced by an amount of lens aberration associated with the first lens aberration pattern; and wherein the second sensitivity coefficient represents a ratio of an amount of pattern placement error that is produced by an amount of lens aberration associated with the second lens aberration pattern.

5. The method of claim 1, wherein the first photomask includes multiple instances of the first overlay pattern arranged in a row across a width of the first photomask;

wherein the second photomask includes multiple instances of the second overlay pattern arranged in a row across a width of the second photomask;

wherein the exposing includes directing radiation out of an exposure slit in the photolithography tool and through the first photomask to form a row of first overlay patterns on the first wafer, the overlay patterns in the row of second overlay patterns formed on the first wafer being respectively associated with a plurality of locations along a length of the exposure slit;

wherein the exposing includes directing radiation out of the exposure slit in the photolithography tool and through the second photomask to form a row of second overlay patterns on the second wafer, the overlay patterns in the row of second overlay patterns formed on the second wafer being respectively associated with the plurality of locations along the length of the exposure slit;

wherein the measuring includes measuring a first relative pattern placement error for each overlay pattern in the row of first overlay patterns on the first wafer; and wherein the measuring includes measuring a second relative pattern placement error for each overlay pattern in the row of second overlay patterns on the second wafer.

6. The method of claim 5, wherein the solving includes solving a system of Zernike polynomial equations for each location in the plurality of locations along the length of the exposure slit using the first and second relative pattern placement errors respectively associated with the plurality of locations to determine values for the first and second Zernike coefficients associated with each location in the plurality of locations along the length of the exposure slit.

7. A method of characterizing photolithography lens quality, comprising:

selecting first and second different overlay patterns;

performing a photolithography simulation to determine a first sensitivity coefficient for the first overlay pattern and a second sensitivity coefficient for the second overlay pattern;

providing first and second photomasks, the first photomask having the first overlay pattern thereon and the second photomask having the second overlay pattern thereon;

exposing, with a photolithography tool, first and second wafers with the first and second photomasks to form the first overlay pattern on the first wafer and the second overlay pattern on the second wafer;

measuring a first relative pattern placement error of the first overlay pattern formed on the first wafer and measuring a second relative pattern placement error of the second overlay pattern formed on the second wafer; and calculating a quality indicator for a lens in the photolithography tool using the first and second relative pattern placement errors and the first and second sensitivity coefficients.

8. The method of claim 7, wherein each of the first and second overlay patterns has a first feature with a first pitch and a second feature with a second pitch different than the first pitch;

wherein the first feature and the second feature on each overlay pattern have the same center point; and wherein measuring the first and second relative pattern placement errors of the first and second overlay patterns formed on the first and second wafers includes measuring a displacement between a center point of the first feature and a center point of the second feature on each of the first and second wafers.

9. The method of claim 8, where each of the first and second overlay patterns is one of a box-in-box pattern and an alternating bar pattern.

10. The method of claim 8, wherein each of the first and second relative pattern placement errors is a vector having a horizontal component value and a vertical component value.

11. The method of claim 7, wherein the first sensitivity coefficient represents a ratio of an amount of pattern placement error that is produced by an amount of lens aberration associated with the first lens aberration pattern; and wherein the second sensitivity coefficient represents a ratio of an amount of pattern placement error that is produced by an amount of lens aberration associated with the second lens aberration pattern.

12. The method of claim 7, wherein the exposing includes exposing the first wafer a plurality of times to form the first overlay pattern in a plurality of fields on the first wafer;

wherein the measuring includes measuring the first relative pattern placement error of each first overlay pattern in the plurality of fields on the first wafer; and wherein the calculating the quality indicator includes:

averaging the first relative pattern placement errors of the first overlay patterns to find an average first relative pattern placement error for the first wafer; and calculating the quality indicator of the lens in the photolithography tool using the average first relative pattern placement error and the first sensitivity coefficient.

13. The method of claim 7, wherein the first photomask includes multiple instances of the first overlay pattern that are arranged in a row across a width of the first photomask;

wherein the exposing includes directing radiation out of an exposure slit in the photolithography tool and through the first photomask to form a row of first overlay patterns on the first wafer, each first overlay pattern in the row of first overlay patterns formed on the first wafer being associated with a location along a length of the exposure slit; and wherein the measuring includes measuring a first relative pattern placement error for each first overlay pattern in the row of first overlay patterns on the first wafer.

14. The method of claim 13, wherein the calculating a quality indicator includes calculating a quality indicator of the lens in the photolithography tool at a plurality of locations on the lens that correspond to locations along the length of the exposure slit using the first relative pattern placement errors of the first overlay patterns in the row of first overlay patterns formed on the first wafer.

15. The method of claim 7, wherein the calculating a quality indicator includes decomposing the first relative pattern placement error into horizontal and vertical components and calculating a horizontal quality indicator using the horizontal component and calculating a vertical quality indicator using the vertical component.

16. The method of claim 7, wherein calculating a quality indicator includes solving a system of Zernike polynomial equations using the first and second relative pattern placement errors and the first and second sensitivity coefficients to determine values for the first and second Zernike coefficients.

17. The method of claim 7, further including comparing the quality indicator against a historical quality indicator of the lens to monitor lens quality drift.

18. A system, comprising:

a photolithography simulation tool configured to determine a first sensitivity coefficient for a first overlay pattern and a second sensitivity coefficient for a second overlay pattern;

a photolithography tool having a lens and an exposure slit, the photolithography tool configured to direct radiation from the exposure slit through a first photomask having the first overlay pattern thereon and onto a first wafer to form the first overlay pattern on the first wafer, the photolithography tool also configured to direct radiation from the exposure slit through a second photomask having the second overlay pattern thereon and onto a second wafer to form the second overlay pattern on the second wafer;

an overlay metrology tool configured to measure a first relative pattern placement error of the first overlay pattern formed on the first wafer and configured to measure a second relative pattern placement error of the second overlay pattern formed on the second wafer; and a data processing tool configured to calculate a quality indicator for the lens in the photolithography tool using the first and second relative pattern placement errors and the first and second sensitivity coefficients.

19. The system of claim 18, wherein each of the first and second overlay patterns has a first feature with a first pitch and a second feature with a second pitch different than the first pitch;

wherein the first feature and the second feature on each overlay pattern have the same center point; and wherein the overlay metrology tool is further configured to measure a displacement between a center point of the first feature and a center point of the second feature on each of the first and second wafers.

20. The system of claim 18, wherein the data processing tool is configured to apply the first and second relative pattern placement errors and the first and second sensitivity coefficients to a system of Zernike polynomial equations to solve for first and second Zernike coefficients, the Zernike coefficients being the quality indicator.

* * * * *